United States Patent [19]
Chen et al.

[11] Patent Number: 5,776,816
[45] Date of Patent: Jul. 7, 1998

[54] NITRIDE DOUBLE ETCHING FOR TWIN WELL ALIGN

[75] Inventors: Chwan Chao Chen; Chia Chen Liu, both of Hsinchu, Taiwan

[73] Assignee: Holtek Microelectronics, Inc., Hsinchu, Taiwan

[21] Appl. No.: 739,056

[22] Filed: Oct. 28, 1996

[51] Int. Cl.⁶ .................................................. H01L 21/76
[52] U.S. Cl. ...................... 438/401; 438/225; 438/227; 438/228; 438/229; 438/975
[58] Field of Search ........................... 437/25, 26, 69, 437/34, 56, 156; 438/225, 227, 228, 229, 401, 975

[56] References Cited

U.S. PATENT DOCUMENTS

| | | | |
|---|---|---|---|
| 5,252,510 | 10/1993 | Lee et al. | 437/924 |
| 5,256,563 | 10/1993 | Moslehi et al. | 437/56 |
| 5,441,902 | 8/1995 | Hsieh et al. | 437/34 |
| 5,460,984 | 10/1995 | Yoshida | 437/924 |
| 5,478,762 | 12/1995 | Chao | 437/34 |

*Primary Examiner*—Trung Dang
*Attorney, Agent, or Firm*—W. Wayne Liauh

[57] ABSTRACT

A method of fabricating alignment marks on an integrated circuit device including steps of: forming first pad oxide layer and first nitride layer on a P-type semiconductor substrate; coating and patterning first photoresist layer by lithography; partially etching first nitride layer to form first nitride pattern by first photoresist etching mask; and ion implanting N-type ions to form an N-doped region; coating and patterning second photoresist layer by lithography; partially etching first nitride pattern to form second nitride pattern; and ion implanting P-type ions to formed a P-doped region. Next, performing thermally drive in N-type and P-type impurities to form N-well and P-well regions, and growing an oxide layer simultaneously. Finally, the height difference between the oxide layer and the second nitride pattern producing a ladder topography can be used as an alignment mark for the succeeding lithographic processes.

9 Claims, 4 Drawing Sheets

NITRIDE DOUBLE ETCHING FOR TWIN WELL ALIGN

BACKGROUND OF THE INVENTION

(a) Field of the Invention

The present invention relates to the fabrication of alignment marks in a twin-well semiconductor device process, and more particularly it uses double nitride etching to manufacture the alignment marks.

(b) Description of Prior Art

There are ruggendness topographies within a semiconductor device structure, and these ruggendness topographies can be used as alignment marks during the lithography steps. For example, the field oxide isolation layer has a thickness of about 1000 to 3000 Angstroms above the silicon substrate, that can be used as the following polysilicon gate alignment marks.

As integrated circuits are miniaturized more and more, these devices introduce a vertical structure more often than a conventional planar structure. Various problems are encountered in the manufacture, for example, with a twin-well process of an integrated circuit device. The U.S. Pat. No. 5,460,984 to Yoshida described such problems for twin-well semiconductor device.

One problem is that the topography between N-well and P-well of a twin-well device is not at the same horizontal level that effects the alignment performance for the steppers. The two most commonly used commercial steppers in today's semiconductor industry are ASM stepper and Nikon stepper. Because the alignment methods of ASM stepper and Nikon stepper are different, one particular twin-well product can not use both ASM steppers and Nikon steppers for mass-production alignment. This phenomenon lowers the production line throughout. If we want to use ASM stepper alignment method in a Nillon stepper, it would need an extra photomask for zero layer alignment. Therefore, it will not only increase the number of manufacturing steps but also increase the production cost.

SUMMARY OF THE INVENTION

The principle object of the present invention is to provide a method of fabricating the alignment marks in a twin-well semiconductor integrated circuits device process.

According to the present invention, the first oxide layer and the first nitride layer are formed in a P-type semiconductor substrate. Then, the first photoresist layer is coated which is overlaying the first nitride layer. The first photoresist layer is patterned by conventional lithography technique to form an etching mask. Next, using first photoresist as a mask, the first nitride layer is patterned by plasma-etch technique. By using the first photoresist and the first nitride layers as a mask, N- type ions are implanted into P-type substrate through the first oxide layer to form an N-doped region. After ion implantation, the first photoresist layer is removed.

Next, the second photoresist pattern is formed by conventional lithograph method again. The first nitride layer is partially plasma-etched to form the second nitride pattern where the second nitride pattern is located between N-well and P-well regions. Using the second photoresist pattern as a mask this time, P type ions are implanted into P-type substrate through the first oxide layer to form a P-doped region. After ion implantation, the second photoresist layer is removed.

Next, the impurities in the N-doped and P-doped regions are thermally driven in a high-temperature environment to form the desired depths of N-well and P-well. During the high-temperature drive-in process, an oxide layer is formed on the second nitride surface simutaneously. Therefore, the vertical height difference between the second nitride pattern and oxide can be used as alignment marks for the succeeding lithographic processes.

Next, the second oxide layer and the third nitride layer are formed. Then, the third photoresist that can be used as etching mask for the third nitride layer is patterned by plasma-etch technology that leave some the second oxide layer uncovered. Finally, a field oxide region is formed by high-temperature oxidation of the uncovered the second oxide layer. Because the field oxide layer is symmetrically located between N-well and P-well regions, it can be used as an ideal alignment mark for lithography process. An effective alignment mark fabrication method that can use both ASM and Nikon steppers to have good control of critical dimension is then achieved.

BRIEF DESCRIPTION OF THE DRAWINGS

In the accompanying drawings forming a material part of this description, there is shown.

DESCRIPTION OF THE PREFERRED EMBODITION

The invention discloses herein is directed to a method of fabricating twin-well alignment marks of integrated circuits. In the following description, numerous details are set forth in order to provide a thorough understanding of the present invention. It will be obvious, however, to one skilled in the art of integrated circuits that these specific details need not be employed to practice the present invention. In other instance, well-known processing steps are not described in detail in order not unnecessarily obscure the present invention.

Figure 1:
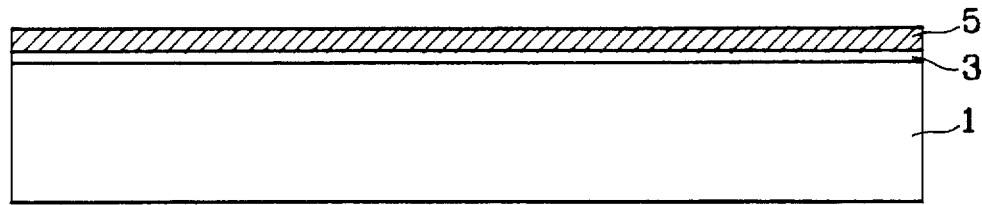
FIGS. 1 through 11 schematically illustrate in cross sectional representation preferred embodiment of this invention.

Referring now more particularly to FIG. 1, continuously forming the first pad oxide layer 3 and the first nitride 5 on a P-type silicon substrate 1 as shown in FIG. 1. The first pad oxide layer 5 that has a thickness of about 320 to 380 Angstroms is formed under 1000° C. thermal oxidation environment. The first nitride layer 5 that has a thickness of about 1350 to 1650 Angstroms is formed by low pressure chemical vapor deposition (LPCVD) technique under the following conditions: it has a base pressure of 350 mTorr, a temperature of 760° C., with reactant gases $SiH_2Cl_2$ and $NH_3$ flowing.

Figure 2:
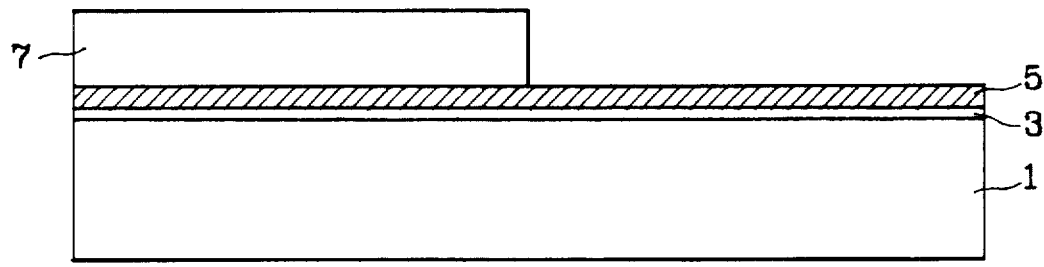

Referring now to FIG. 2, the first photoresist layer 7 is selectively patterned by a conventional lithography method.

Figure 3:
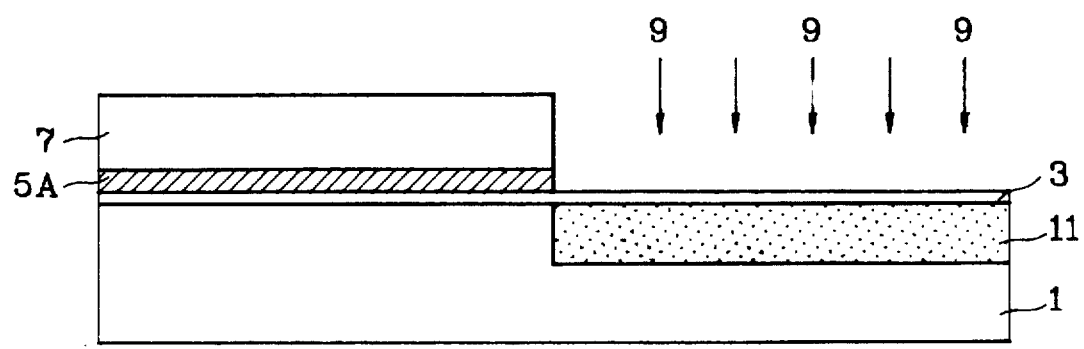

Referring now to FIG. 3, by using the first photoresist pattern 7 as a mask, the first nitride layer 5 is partially etched by plasmaetch technique to form the first nitride pattern 5A. The plasmaetch process can use magnetic enhanced reactive ion etching (MERIE), electron cyclotron etching (ECR), or conventional reaction ion etching (RIE) method. In present invention, it usually uses the MERIE method with reactant gases of $CF_4$, $CHF_3$, Ar and $O_2$.

Referring now to FIG. 3, again, by using the first photoresist pattern 7 as a mask, N-type ion beams 9 are implanted into P-type silicon substrate 1 to form an N-doped region 11 as shown in FIG. 3. The N-type impurities that are ion implanted into P-type substrate are preferred to use Phosphorus ($P^{31}$), with an implantation energy of 50 to 150 keV, and an implantation dose of $10^{11}$ to $10^{13}$ cm$^{-2}$.

Figure 4:
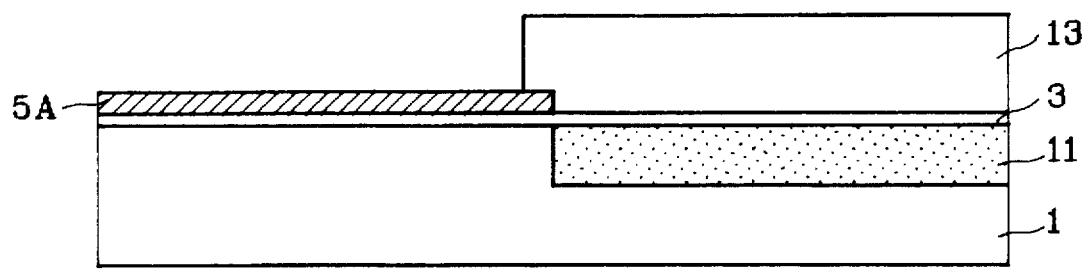

Referring now to FIG. 4, the first photoresist layer 7 is stripped by oxygen plasma and sulfuric acid ($H_2SO_4$). Then, the second photoresist layer 13 is coated then selectively patterned by lithography technique.

Figure 5:
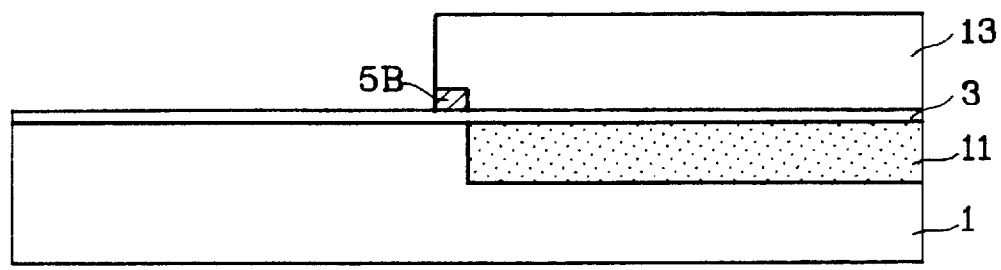

Referring now to FIG. 5, the remaining first nitride pattern 5A is partially etched by using the second photoresist layer 13 to obtain the second nitride pattern 5B that is located in the middle of N-well and P-well junction.

Figure 6:
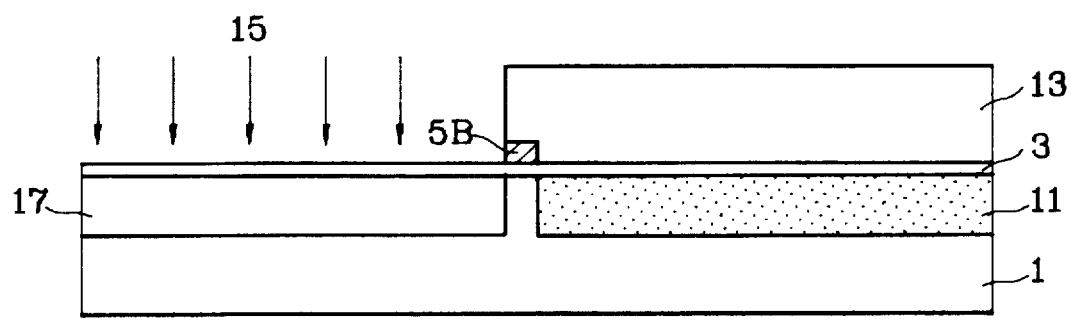

Referring now to FIG. 6, in order to form P-doped region 17, P-type ion beams 15 are implanted into the silicon substrate. The P-type impurities that are ion implanted into silicon substrate are preferred to use Boron ($B^{11}$) or borondiflouride ($BF_2$) ions, with an implantation energy of 10 to 80 keV, and an implantation dose of $10^{12}$ to $10^{13}$ $cm^{-2}$. Thereafter, the second photoresist 13 is removed.

Figure 7:
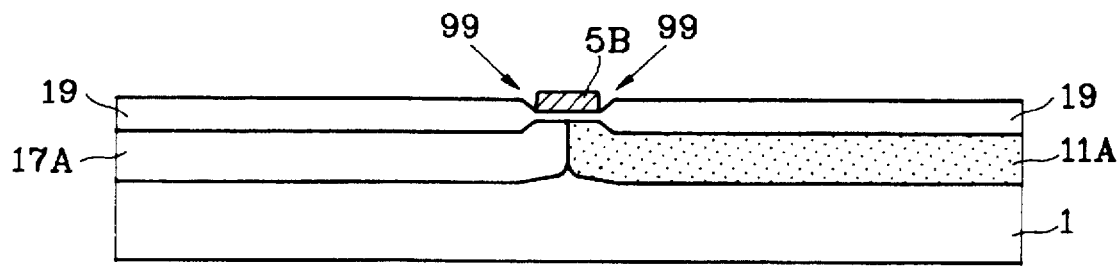

Referring now to FIG. 7, thermally drive-in in nitrogen and oxygen environment is carried out for the purpose of activating of impurities and obtaining the desired depths, to thereby form an N-well region 11A and P-well region 17A and thus a twin well. In the mean time, an oxide layer 19 that has a thickness of 2000 to 2400 Angstroms is simultaneously formed during the thermal drive-in process. As shown in FIG. 7, there is about 1000 Angstroms thick of ladder 99 between oxide layer 19 and second nitride pattern 5B after well drive-in. The planer topography near the ladder 99 can be used as an alignment mark for the succeeding process that is the key point of the present invention.

Figure 8:
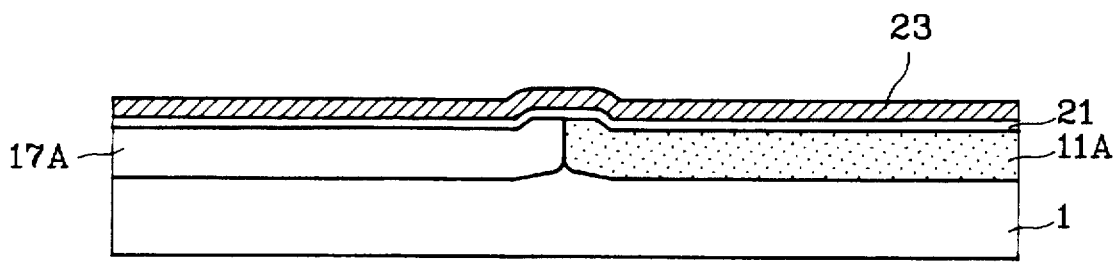

Referring now to FIG. 8, after second nitride pattern 5B is removed, second pad oxide layer 21 and third nitride layer 23 are continuously formed overlying the twin well regions.

Figure 9:
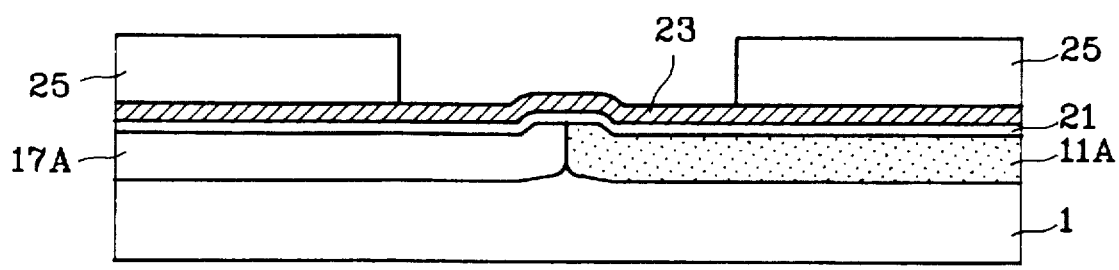

Referring now to FIG. 9, the third photoresist regions 25 are selecting patterned by conventional lithography technique.

Figure 10:
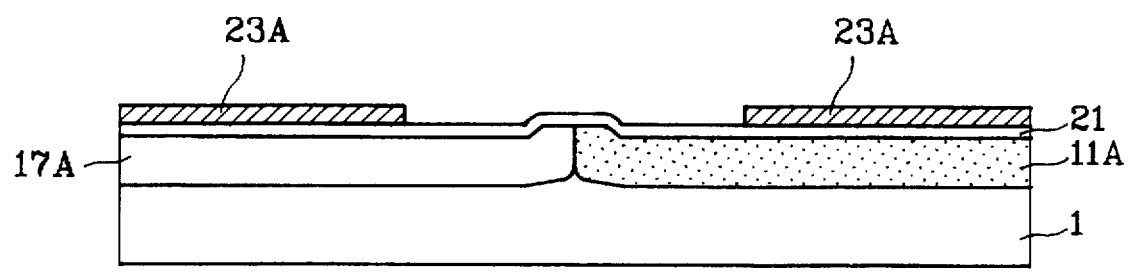

Referring now to FIG. 10, by using third photoresist regions 25 as a mask, the third nitride layer is etched by plasma-etch method to form the third nitride pattern 23A.

Figure 11:
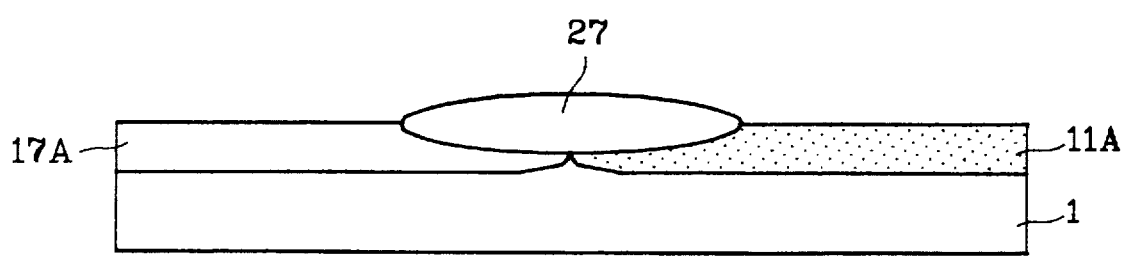

Referring now to FIG. 11, by using third nitride pattern 23A as an oxidation mask, a field oxide region 27 is formed in an oxygen environment with a temperature range of 925° to 975° C. for 150 to 200 minutes. The thickness of the field oxide region 27 is about 4000 to 6000 Angstroms. Thereafter, the third nitride pattern and the second pad oxide layer are removed. The fmal twin well structure of the preferred embodiment of the present invention is then completed.

As described in detail, according to the present invention, the field oxide region 27 that is symmetrically located between N-well and P-well regions has a smooth topography.

Therefore, the field oxide region 27 can be used as an ideal alignment mark for the succeeding lithographic steps that can reduce the number of processing steps so as to increase production through put.

While the present invention has been particularly shown and described with reference to a preferred embodiment, it will be understand by those skilled in the art that various changes in form and detail may be without departing from the spirit and scope of the present invention.

What is claimed is:

1. A method of fabricating alignment marks on integrated circuit devices, comprising the steps of:

forming first pad oxide layer on a P-type semiconductor substrate;

forming first nitride layer overlaying said first pad oxide layer;

coating first photoresist layer overlaying said first nitride layer;

patterning said first photoresist layer by lithography technique;

partially etching said first nitride layer to form a first nitride pattern by using said first photoresist as an etching mask;

ion implanting N-type impurities through said first pad oxide layer into said P-type semiconductor substrate to form a N-type region defined by said the first nitride pattern;

stripping said first photoresist layer;

coating and then patterning a second photoresist layer overlaying said first nitride pattern by lithography technique;

partially etching said first nitride pattern for forming a second nitride pattern by using second photoresist as an etching mask;

ion implanting P-type impurities through said first pad oxide layer into said P-type semiconductor substrate to form a P-doped region defined by said second nitride pattern;

thermally driving in for activating said N-doped and said P-doped regions to form N-well and P-well regions, respectively; and simultaneously forming a thermally activated oxide layer on said P-type semiconductor substrate which is not covered by said second nitride pattern, wherein a step is created between said thermally activated oxide layer and said second nitride pattern;

removing said second nitride pattern and said thermally activated oxide layer;

forming a second pad oxide layer overlaying said P-type semiconductor substrate;

forming a third nitride layer overlaying said second pad oxide layer;

coating and patterning a third photoresist layer overlaying said third nitride layer by lithography;

partially etching said third nitride layer for forming a third nitride pattern by using said third photoresist as an etching mask; and thermally oxidizing said second pad oxide layer that is not covered by said third nitride pattern in high-temperature oxygen environment to form a field oxide region, which serves an alignmark for both said N-well and P-well regions.

2. The method of claim 1, wherein said second nitride pattern is located between said N-doped and P-doped regions.

3. The method of claim 1, wherein said first pad oxide layer which is formed in a temperature of 800° to 1000° C. hightemperature oxygen environment, has a thickness of about between 320 to 380 Angstroms.

4. The method of claim 1, wherein said first nitride layer which is formed by low pressure chemical vapor deposition (LPCVD) has a thickness of about between 1350 to 1650 Angstroms.

5. The method of claim 1, wherein said N-doped region which is formed by ion implantation technique, is doped with Phosphorus ($P^{31}$) ions, with an implantation energy of 50 to 150 keV, and an implantation dose of $10^{11}$ to $10^{13}$ $cm^{-2}$.

6. The method of claim 1, wherein said P-doped region which is formed by ion implantation technique, is doped with boron ($B^{11}$) or borondifluoride ($BF_2$) ions, with an implantation energy of 10 to 80 keV, and an implantation dose of $10^{12}$ to $10^{13}$ $cm^{-2}$.

7. The method of claim 1, wherein said second pad oxide layer which is formed in a temperature of 800° to 1000° C. hightemperature oxygen environment, has a thickness of about between 320 to 380 Angstroms.

8. The method of claim 1, wherein said third nitride layer which is formed by now pressure chemical vapor deposition (LPCVD) technique, has a thickness of 1350 to 1650 Angstroms.

9. The method of claim 1, wherein said a P-type semiconductor substrate can be replaced by an N-type semiconductor substrate.

* * * * *